United States Patent
Lin et al.

(10) Patent No.: US 6,794,295 B1
(45) Date of Patent: Sep. 21, 2004

(54) METHOD TO IMPROVE STABILITY AND RELIABILITY OF CVD LOW K DIELECTRIC

(75) Inventors: Cheng Chung Lin, Taipei (TW); Lain-Jong Li, Hualien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 09/579,542

(22) Filed: May 26, 2000

(51) Int. Cl.[7] .............................................. H01L 21/302
(52) U.S. Cl. ...................... 438/706; 438/710; 438/712; 427/249.5
(58) Field of Search ................................ 438/706, 710, 438/712, 705, 637, 638, 639, 780, 781; 427/249.5, 255.37, 563, 489, 492, 249.15; 257/758, 759

(56) References Cited

U.S. PATENT DOCUMENTS

| | | | | |
|---|---|---|---|---|
| 4,992,306 A | | 2/1991 | Hochberg et al. ......... | 427/255.3 |
| 5,432,129 A | | 7/1995 | Hodges ...................... | 437/200 |
| 5,514,624 A | | 5/1996 | Morozumi .................. | 437/195 |
| 5,593,741 A | | 1/1997 | Ikeda ......................... | 427/579 |
| 5,821,603 A | * | 10/1998 | Puntambekar .............. | 257/640 |
| 5,877,032 A | * | 3/1999 | Guinn et al. ................... | 438/9 |
| 6,140,688 A | * | 10/2000 | Gardner et al. ............. | 257/412 |
| 6,159,559 A | * | 12/2000 | Reber et al. ................ | 427/579 |
| 6,159,845 A | * | 12/2000 | Yew et al. ................... | 438/637 |
| 6,168,726 B1 | * | 1/2001 | Li et al. ....................... | 216/79 |
| 6,191,026 B1 | * | 2/2001 | Rana et al. ................. | 438/624 |
| 6,200,911 B1 | * | 3/2001 | Narwankar et al. ........ | 438/758 |
| 6,210,745 B1 | * | 4/2001 | Gaughan et al. ............... | 427/8 |
| 6,228,781 B1 | * | 5/2001 | Murugesh et al. .......... | 438/784 |
| 6,252,303 B1 | * | 6/2001 | Huang ........................ | 257/758 |
| 6,287,990 B1 | * | 9/2001 | Cheung et al. ............. | 438/780 |
| 6,413,583 B1 | * | 7/2002 | Moghadam et al. ... | 427/249.15 |
| 6,541,369 B2 | * | 4/2003 | Huang et al. ............... | 438/624 |

OTHER PUBLICATIONS

The Applied Materials Website for Mar. 4, 2000—Gives Reference to Black Diamond.

* cited by examiner

Primary Examiner—Lan Vinh
(74) Attorney, Agent, or Firm—Haynes and Boone, LLP

(57) ABSTRACT

A process for depositing, through plasma enhanced chemical vapor deposition, inorganic films having low dielectric constant is disclosed. After deposition under low power for a few seconds the power is raised to high for a few seconds, deposition of the film continuing to alternate between low and high power modes until the total desired thickness is reached. Additionally, for the deposition of materials such as black diamond, oxygen is added to the plasma during the high power phase (and removed during the low power phase). We have found that films deposited in this way have low flat band voltages, close to zero, and are, in general, more robust than films deposited according to prior art methods. In particular, these films are free of the cracking problems often encountered during chemical mechanical polishing of films of this type during the formation of damascene structures.

18 Claims, 2 Drawing Sheets

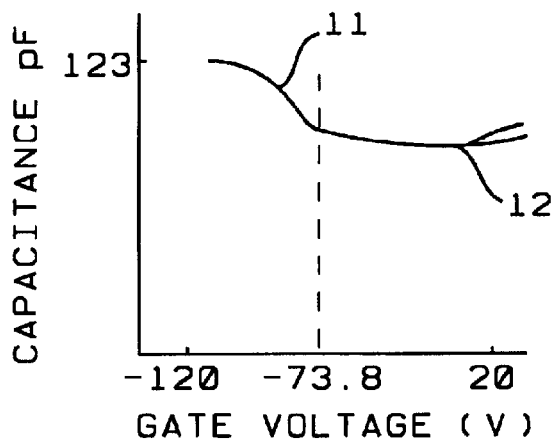
*FIG. 1 - Prior Art*
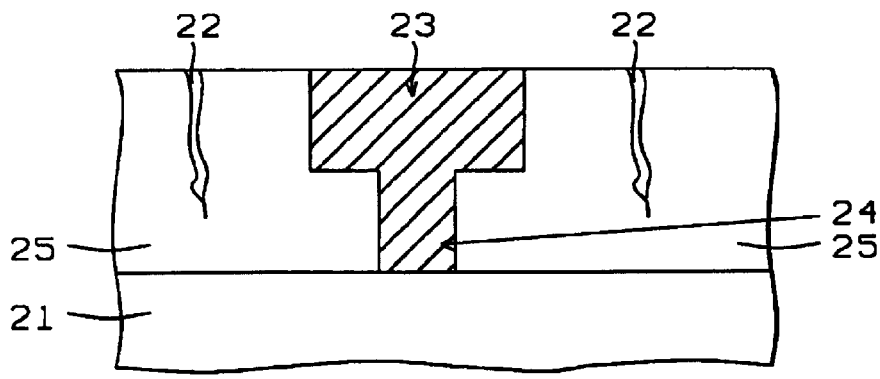
*FIG. 2 - Prior Art*
| (1) GASEOUS MIXTURE OF HELIUM, METHYL SILANE, AND NITROUS OXIDE |
|---|
| (2) FORM PLASMA AT LOW POWER TO INITIATE CVD OF BLACK DIAMOND FILM |
| (3) ADD OXYGEN AND FORM PLASMA AT HIGH POWER TO CONTINUE CVD OF BLACK DIAMOND FILM |
| (4) REPEAT STEPS (2) AND (3) UNTIL DESIRED FILM THICKNESS IS ACHIEVED |
*FIG. 3*

METHOD TO IMPROVE STABILITY AND RELIABILITY OF CVD LOW K DIELECTRIC

FIELD OF THE INVENTION

The invention relates to the general field of low dielectric constant layers for use in integrated circuits with particular reference to black diamond films and methods for reducing the flat band voltage.

BACKGROUND OF THE INVENTION

The internal dimensions within integrated circuits continue to shrink, including the thicknesses of the dielectric layers used to separate various layers of wiring from one another. However, as these wiring levels are brought closer together, the possibility of cross-coupling between them starts to rise as well as the incidence of parasitic capacitances. One way to minimize this problem is to reduce the dielectric constants of these inter-metal layers. Thus, there is considerable interest in developing low k materials as well as deposition methods for them that are compatible with integrated circuit technology.

For our purposes we will define a low k dielectric as one that has a dielectric constant close to or less than about 3. Several such materials are known to exist but they have the disadvantage that they are organic rather than inorganic compounds. These materials are innately soft, which physical property can give rise to problems during semiconductor processing, particularly during planarization, by chemical mechanical polishing (CMP).

The present invention is concerned with low dielectric constant materials that are inorganic in nature, such as spin-on glass (SOG), fluorinated silicon glass (FSG) and, particularly, methyl-doped porous silica which is referred to by practitioners of the art as black diamond, or BD. When formed as will be described below, about 36% of a BD layer's volume is in the form of pores having a diameter between about 8 and 24 Angstroms.

The low k films to which the present invention is directed are those that are deposited by means of PECVD (plasma enhanced chemical vapor deposition), of which black diamond is a prime example. A particular problem associated with this mode of deposition for dielectrics is the trapping of charge during their formation. The effects of this show up by their influence on the flat band voltage. This is a quantity derived from a capacitance-voltage curve of the dielectric in question. An example of this, for a typical black diamond layer formed according to the teachings of the prior art is shown in FIG. 1.

As seen in FIG. 1, the capacitance of the layer decreases with voltage along section 11 of the curve until a value of 73 volts is reached, at which point the curve becomes relatively independent of voltage (section 12). The voltage at which this change occurs is the flat band voltage and it is a measure of the charging tendency of the film. This closely correlates with the leakage current through the dielectric so it is important to reduce the flat band voltage to a value as close to zero as possible.

Dual damascene structures have received widespread application in recent years so it is important that processes for laying down low dielectric constant materials be compatible with such structures. An example of a dual damascene structure is schematially illustrated in FIG. 2. Seen there is a substrate 21 over which dielectric layer 25 has been deposited. Via hole 24 extends from the bottom of trench 23 (long dimension running normal to the plane of the figure) down to the level of substrate 21. Via and trench were over-filled with metal (usually copper) and then the upper surface was planarized, as shown.

One of the problems associated with inorganic low k films, deposited according to the teachings of the prior art, is a tendency to form cracks such as 22 as a byproduct of CMP during the formation of damascene structures. Some of these cracks may, on life, extend all the way through to the substrate. The present invention teaches a process whereby films that are immune to crack formation during CMP, as well as possessing very low flat band voltages, may be formed.

A routine search of the prior art was performed but no references that teach the exact processes and structures of the present invention were discovered. Several references of interest were, however, encountered along the way. For example, in U.S. Pat. No. 5,593,741 Ikeda shows a low K CVD process that varies the RF power during deposition and flows oxygen gas. See abstract and col. 4 lines 30–44. U.S. Pat. No. 5,514,624(Morozumi) shows a low k oxide layer using an organosilicate reactant and an oxygen flow. In U.S. Pat. No. 5,432,129 Hodges shows an oxygen densification step for an oxide. Reference to "Black Diamond" can be found on the Applied Materials website for Mar. 14, 2000. Also, in U.S. Pat. No. 4,992,306, Hochberg et al. show a PECVD $SiO_2$ process.

SUMMARY OF THE INVENTION

It has been an object of the present invention to provide a process for depositing, through plasma enhanced chemical vapor deposition, an inorganic film of low dielectric constant.

Another object of the invention has been that said film be of high quality and reliability.

Yet another object of the invention has been that said film exhibit very low flat band voltages.

A further object has been that said film be fully compatible with use within a damascene process, particularly when chemical mechanical polishing is used.

A still further object has been that said film be free of cracks and have good adhesion, particularly after chemical mechanical polishing.

These objects have been achieved by alternating deposition of the film between low and high power modes. After deposition under low power for a few seconds the power is raised to high for a few seconds and so on, going back and forth between low and high power until the desired thickness of the film is reached. Additionally, for the deposition of materials such as black diamond, oxygen is added to the plasma during the high power phase (and removed during the low power phase). We have found that films deposited in this way have low flat band voltages, close to zero, and are, in general, more robust that films deposited according to prior art methods. In particular, these films are free of the cracking problems often encountered during chemical mechanical polishing of prior art films.

BRIEF DESCRIPTION OF THE DRAWINGS

FIG. 1 is a capacitance-voltage curve of a low k film deposited according to the teachings of the prior art.

FIG. 2 is a dual damascene structure that includes a low k film deposited according to the teachings of the prior art.

FIG. 3 is a flow chart illustrating the process for depositing a layer of black diamond that is disclosed in the present invention.

DESCRIPTION OF THE PREFERRED EMBODIMENTS

We will describe the process of the present invention in terms of forming a damascene structure from a layer of low dielectric constant material, but it is to be understood that the process is not limited to damascene structures or to black diamond but could be used in any situation where an inorganic layer of low dielectric constant material, that is deposited by means of PECVD is required.

Figure 5:
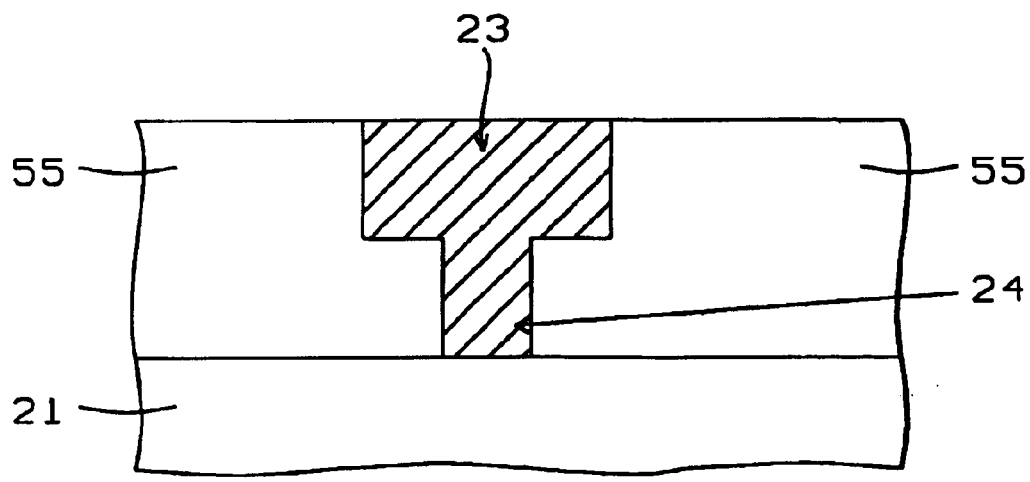
FIG. 5 is a dual damascene structure that includes a low k film deposited according to the teachings of the present invention.

The process of the present invention begins with the provision of a substrate, usually a silicon wafer, in which a partially completed integrated circuit is already present, as illustrated in FIG. 5. Then, a first layer of black diamond is deposited on this substrate under conditions of low power. Deposition is from a gaseous mixture of methyl silane and nitrous oxide, enhanced by a helium plasma, the key feature of this step being that the power level (of the plasma discharge) is less than about 200 watts, no higher. For this gaseous mixture, the methyl silane has a flow rate less than about 200 SCCM, the nitrous oxide has a flow rate that is less than about 800 SCCM, and the helium has a flow rate that is less than about 3,000 SCCM.

Deposition of this low power layer continues for only about 10 seconds, the resulting layer of black diamond having a thickness between about 700 and 1,000 Angstroms. At this point oxygen is added to the gaseous mixture and the power level is simultaneously raised to between about 50 and 200 watts, no lower. Deposition of this high power layer on the low power layer continues for about 10 additional seconds, resulting in a high power layer having a thickness between about 700 and 1,000 Angstroms. For this gaseous mixture, the methyl silane has a flow rate that is less than about 200 SCCM, the nitrous oxide has a flow rate that is less than about 800 SCCM, the helium has a flow rate that is less than about 3,000 SCCM, and the oxygen has a flow rate that is less than about 100 SCCM.

The process of alternately depositing a low power layer and then depositing a high power layer (along with the addition of oxygen to the gas during the high power phase) continues until the total thickness of the deposited film reaches some predetermined thickness, typically between about 3,000 and 10,000 Angstroms, resulting in the formation of layer 55.

Figure 4:
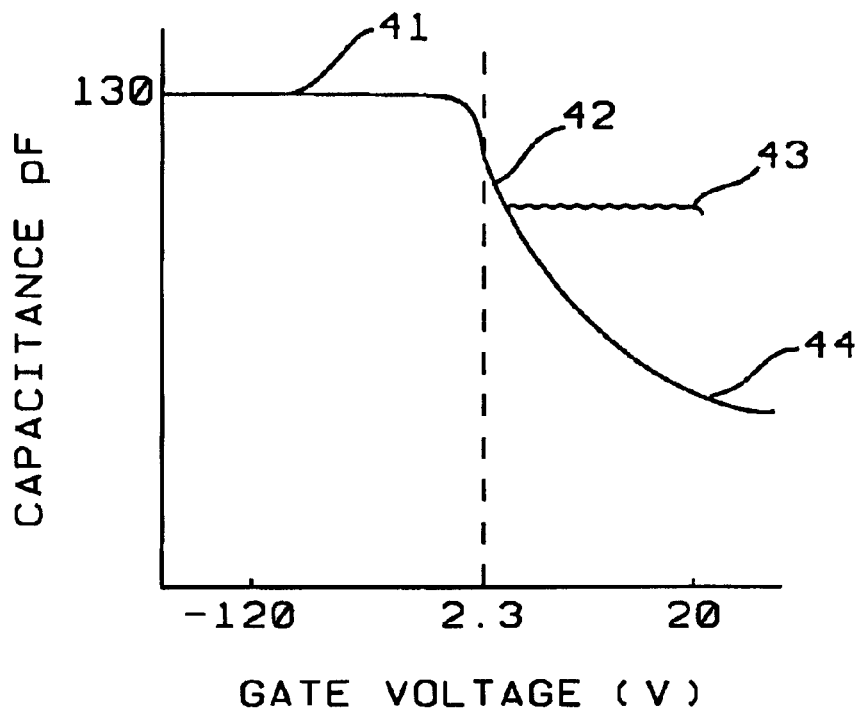
FIG. 4 is a capacitance-voltage curve of a low k film deposited according to the teachings of the present invention.

This portion of the process, namely the preparation of the black diamond film, is summarized in flow chart form in FIG. 3. As already noted, the key feature of alternating low and high power during deposition is not limited to black diamond, being applicable to the deposition of other low dielectric constant inorganic materials such as amorphous, and/or fluorinated, and/or carbonated, silicon glass. The effectiveness of this method of preparation is illustrated in FIG. 4 which shows a C-V plot similar to that shown in FIG. 1 except that it is for a film deposited according to the teachings of the present invention. As can be seen, portion 41 is relatively flat. This is followed by a short section 42 where the capacitance is voltage dependent and then again a flat section 43 that is independent of voltage. Section 43 begins at −2 volts, this being the flat band voltage of the film. The division of section 42 into a second branch 44 is because the voltage applied for measurement purposes changes the charge distribution in the film.

Returning now to FIG. 5, with formation of the low k layer 55 completed, said layer is then patterned and etched to form wiring trench 23 which has a depth of between about 3,000 and 10,000 Angstroms. This is followed by a second patterning and etching step which results in the formation of via hole 24, said via hole extending from the bottom of the trench all the way down to the level of the silicon wafer and having a width of between about 3,000 and 10,000 Angstroms.

The next step is the deposition of a layer of copper to a thickness sufficient to fill via hole 24 and to over-fill wiring trench 23. Then, by means of CMP, the excess copper is removed until the wiring trench is just filled and there is no copper on any exposed surface outside it The resulting damascene structure is seen in FIG. 5. Unlike prior art structures, such as shown in FIG. 2, damascene structures formed as just described are free of cracking and peeling.

While the invention has been particularly shown and described with reference to the preferred embodiments thereof, it will be understood by those skilled in the art that various changes in form and details may be made without departing from the spirit and scope of the invention.

What is claimed is:

1. A process for forming a layer of low dielectric constant material having a predetermined thickness, comprising:

depositing a first layer of low dielectric constant material by means of plasma enhanced vapor deposition, at a first level of power applied to only said plasma;

then, with no intervening steps, depositing a second layer of the low dielectric constant material by means of plasma enhanced vapor deposition, at a second power level, applied to only said plasma, that is higher than said first power level; and repeating the preceding two steps until the predetermined thickness is reached, said layer of low dielectric constant material having a flat band voltage that is less than about −3 volts.

2. The process recited in claim 1 wherein the low k dielectric material is selected from the group consisting of fluorinated silicon glass, black diamond, carbonated silicon glass, and amorphous silicon glass.

3. The process recited in claim 1 wherein the first layer of low dielectric constant material is deposited to a thickness between about 700 and 1,000 Angstroms.

4. The process recited in claim 1 wherein the second layer of low dielectric constant material is deposited to a thickness between about 700 and 1,000 Angstroms.

5. The process recited in claim 1 wherein said predetermined thickness between about 3,000 and 10,000 Angstroms.

6. The process recited in claim 1 wherein the first power level is less than about 70 watts.

7. The process recited in claim 1 wherein the second power level is between about 70 and 200 watts.

8. A process for depositing a layer of black diamond on a silicon wafer to a predetermined thickness, comprising:

through chemical vapor deposition, from a first gaseous mixture of methyl silane and nitrous oxide, enhanced by a helium plasma at a power level to only said plasma that is less than about 70 watts, depositing a low power layer of black diamond for about 10 seconds, thereby forming a layer having a thickness between about 700 and 1,000 Angstroms;

then through chemical vapor deposition, from a second gaseous mixture of methyl silane, nitrous oxide, and oxygen, enhanced by a helium plasma at a power level, to only said plasma, of between about 70 and 200 watts, depositing onto said low power layer a high power layer of black diamond for about 10 seconds, thereby forming a layer having a thickness between about 700 and 1,000 Angstroms; and repeating the preceding two steps until the predetermined thickness is reached. said layer of black diamond having a flat band voltage that is less than about −3 volts.

9. The process recited in claim 8 wherein said predetermined thickness is between about 3,000 and 10,000 Angstroms.

10. The process recited in claim 8 wherein, in the first gaseous mixture, the methyl silane has a flow rate that is less than about 200 SCCM, the nitrous oxide has a flow rate that is less than about 800 SCCM, and the helium has a flow rate that is less than about 3,000 SCCM.

11. The process recited in claim 8 wherein, in the second gaseous mixture, the methyl silane has a flow rate that is less than about 200 SCCM, the nitrous oxide has a flow rate that is less than about 800 SCCM, the helium has a flow rate that is less than about 3,000 SCCM, and the oxygen has a flow rate that is less than about 100 SCCM.

12. A process for forming a dual damascene structure on a silicon wafer, comprising:

through chemical vapor deposition, from a first gaseous mixture of methyl silane and nitrous oxide, enhanced by a helium plasma at a power level, to only said plasma, that is less than about 70 watts, depositing a low power layer of black diamond for about 10 seconds, thereby forming a layer having a thickness between about 700 and 1,000 Angstroms;

then through chemical vapor deposition, from a second gaseous mixture of methyl silane, nitrous oxide, and oxygen, enhanced by a helium plasma at a power level, to only said plasma, of between about 70 and 200 watts, depositing onto said low power layer a high power layer of black diamond for about 10 seconds, thereby forming a layer having a thickness between about 700 and 1,000 Angstroms;

repeating the preceding two steps until a completed black diamond layer has been formed;

patterning and etching said completed black diamond layer in order to form a wiring trench;

patterning and etching said wiring trench down to the level of the silicon wafer, thereby forming a via hole;

depositing a layer of copper to a thickness sufficient to fill the via hole and to over-fill the wiring trench; and by means of chemical mechanical polishing, removing copper until said wiring trench is just filled and there is no copper on any exposed surface outside the trench, thereby forming said damascene structure and whereby said damascene structure is free of cracking and peeling.

13. The process recited in claim 12 wherein said completed layer thickness is between about 3,000 and 10,000 Angstroms.

14. The process recited in claim 12 wherein, in the first gaseous mixture, the methyl silane has a flow rate that is less than about 200 SCCM, the nitrous oxide has a flow rate that is less than about 800 SCCM, and the helium has a flow rate that is less than about 3,000 SCCM.

15. The process recited in claim 12 wherein, in the second gaseous mixture, the methyl silane has a flow rate that is less than about 200 SCCM, the nitrous oxide has a flow rate that is less than about 800 SCCM, the helium has a flow rate that is less than about 3,000 SCCM, and the oxygen has a flow rate that is less than about 100 SCCM.

16. The process recited in claim 12 wherein the completed layer of black diamond has a flat band voltage that is less than about −3 volts.

17. The process recited in claim 12 wherein the trench has depth of between about 3,000 and 10,000 Angstroms.

18. The process recited in claim 12 wherein the via hole has a width of between about 3,000 and 10,000 microns.

\* \* \* \* \*